(12) United States Patent
Aruga et al.

(10) Patent No.: US 8,715,431 B2
(45) Date of Patent: *May 6, 2014

(54) COPPER ALLOY PLATE FOR ELECTRIC AND ELECTRONIC PARTS HAVING BENDING WORKABILITY

(75) Inventors: Yasuhiro Aruga, Kobe (JP); Katsura Kajihara, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 765 days.

This patent is subject to a terminal disclaimer.

(21) Appl. No.: 11/573,041

(22) PCT Filed: Aug. 11, 2005

(86) PCT No.: PCT/JP2005/014753
§ 371 (c)(1), (2), (4) Date: Feb. 1, 2007

(87) PCT Pub. No.: WO2006/019035
PCT Pub. Date: Feb. 23, 2006

(65) Prior Publication Data
US 2009/0010797 A1  Jan. 8, 2009

(30) Foreign Application Priority Data

Aug. 17, 2004 (JP) ................. 2004-237490

(51) Int. Cl.
*C22C 9/00* (2006.01)
*C22C 9/06* (2006.01)

(52) U.S. Cl.
USPC ........... 148/432; 148/433; 148/434; 148/435; 148/436; 420/496; 420/499

(58) Field of Classification Search
USPC ........................... 148/432–436; 420/496, 499
See application file for complete search history.

(56) References Cited

U.S. PATENT DOCUMENTS

| | | | |
|---|---|---|---|
| 3,639,119 A * | 2/1972 | McLain | 420/473 |
| 6,132,529 A | 10/2000 | Hatakeyama et al. | |
| 2005/0161126 A1 | 7/2005 | Aruga et al. | |
| 2006/0137773 A1 | 6/2006 | Aruga et al. | |
| 2007/0148032 A1 | 6/2007 | Aruga et al. | |
| 2008/0025867 A1 | 1/2008 | Aruga et al. | |
| 2012/0039741 A1 | 2/2012 | Aruga et al. | |
| 2012/0039742 A1 | 2/2012 | Aruga et al. | |
| 2012/0039743 A1 | 2/2012 | Aruga et al. | |

FOREIGN PATENT DOCUMENTS

| | | | |
|---|---|---|---|
| JP | 3-188235 | | 8/1991 |
| JP | 6 235035 | | 8/1994 |
| JP | 11080863 | * | 3/1999 |
| JP | 2000 178670 | | 6/2000 |
| JP | 2000 328157 | | 11/2000 |
| JP | 2001 279347 | | 10/2001 |
| JP | 2002-3965 | | 1/2002 |
| JP | 2002 339028 | | 11/2002 |
| JP | 2004 285449 | | 10/2004 |
| JP | 2005 029857 | | 2/2005 |
| KR | 1987-0001504 | | 4/1985 |
| KR | 1995-7004527 | | 11/1995 |
| WO | WO 02/00949 A2 | | 1/2002 |
| WO | WO 02/00949 A3 | | 1/2002 |

OTHER PUBLICATIONS

U.S. Appl. No. 12/672,092, filed Feb. 4, 2010, Aruga et al.
U.S. Appl. No. 12/811,339, filed Jun. 30, 2010, Aruga.
U.S. Appl. No. 13/585,076, filed Aug. 14, 2012, Aurga, et al.
Korean Office Action dated May 29, 2008 w/English Translation. Application No. 10-2007-7002825.

* cited by examiner

*Primary Examiner* — Sikyin Ip
(74) *Attorney, Agent, or Firm* — Oblon, Spivak, McClelland, Maier & Neustadt, L.L.P.

(57) ABSTRACT

A Cu—Fe—P copper alloy sheet which has the high strength and the high electrical conductivity compatible with excellent bendability is provided. The Cu—Fe—P copper alloy sheet contains 0.01% to 3.0% of Fe and 0.01% to 0.3% of P on a percent by mass basis, wherein the orientation density of the Brass orientation is 20 or less and the sum of the orientation densities of the Brass orientation, the S orientation, and the Copper orientation is 10 or more and 50 or less in the microstructure of the copper alloy sheet.

10 Claims, No Drawings

COPPER ALLOY PLATE FOR ELECTRIC AND ELECTRONIC PARTS HAVING BENDING WORKABILITY

TECHNICAL FIELD

The present invention relates to a copper alloy having high strength, high electrical conductivity, and excellent bendability. For example, the present invention relates to a copper alloy suitable for a raw material of an IC lead frame for semiconductor device.

The copper alloy of the present invention is used for various electric and electronic components, in addition to the IC lead frame for semiconductor device. Examples of uses include other semiconductor components; materials for electric and electronic components, e.g., printed wiring boards; switch components; and mechanical components, e.g., busbars, terminals, and connectors. The following description primarily relates to a typical example of applications, that is, the case where the copper alloy is used for an IC lead frame serving as a semiconductor component.

BACKGROUND ART

In general, Cu—Fe—P copper alloys have been previously used as copper alloys for semiconductor IC lead frames. Examples of these Cu—Fe—P copper alloys include a copper alloy (C19210 alloy) containing 0.05% to 0.15% of Fe and 0.025% to 0.040% of P and a copper alloy (CDA194 alloy) containing 2.1% to 2.6% of Fe, 0.015% to 0.15% of P, and 0.05% to 0.20% of Zn. Among copper alloys, these Cu—Fe—P copper alloys exhibit high strength, high electrical conductivity, and high thermal conductivity when an intermetallic compound, e.g., Fe or Fe and P, is dispersed in a copper matrix, and therefore, these have been generally used as the international standard alloys.

In recent years, as a semiconductor device has been required to have a larger capacity, a smaller size, and higher integration, the cross-sectional area of an IC lead frame is being reduced, and higher levels of strength, electrical conductivity, and thermal conductivity are required. With the trends, a copper alloy component used for an IC lead frame in a semiconductor device is required to have yet higher strength, electrical conductivity, and thermal conductivity.

For example, guidelines of the above-described increase in strength and increase in electrical conductivity required of the copper alloy sheet used for the IC lead frame are the strength of the copper alloy sheet of 150 Hv or more in terms of hardness and the electrical conductivity of 75% IACS or more. The situation of the increase in strength and the increase in electrical conductivity is also applicable to a copper alloy used for not only IC lead frames but also other electrically conductive components such as connectors, terminals, switches, relays, etc., in electric and electronic components.

An advantage of the above-described Cu—Fe—P copper alloy is that it has a high electrical conductivity and, in order to increase its strength, a means of increasing the contents of Fe and P or adding Sn, Mg, Ca, or the like as a third element has so far been taken. However, the increase of the amount of such elements causes strength to be increased but an electrical conductivity to deteriorate inevitably. Therefore, it has been difficult merely by controlling the chemical composition of a copper alloy to realize a Cu—Fe—P copper alloy having a good balance between a higher electrical conductivity and a higher strength or simultaneously having both the properties which are required along with the above-described trends of a larger capacity, a smaller size, and higher integration of a semiconductor device.

To cope with the difficulty, it has hitherto been proposed to control the microstructure or the precipitation state of dispersoids in a Cu—Fe—P copper alloy. For example, a copper alloy having a high strength and high electrical conductivity is proposed in which chemical compounds containing Fe and P of 0.2 μm or less are homogeneously dispersed (refer to Patent Document 1).

The copper alloy sheet used for IC lead frames, terminals, connectors, switches, relays, and the like is required to have excellent bendability capable of enduring sharp bending, e.g., U-bending or 90° bending after notching, as well as the high strength and the high electrical conductivity.

However, the above-described addition of solid-solution hardening elements, e.g., Sn and Mg, or the increase in strength by increasing reduction ratios of the cold rolling inevitably cause deterioration of the bendability and, therefore, the required strength and the bendability cannot become mutually compatible.

On the other hand, it is known that the bendability can be improved to some extent by grain refining or by controlling the state of dispersoids (refer to Patent Documents 2 and 3). However, in order to produce a Cu—Fe—P high-strength materials (the hardness of copper alloy sheet is 150 Hv or more, and the electrical conductivity is 75% IACS or more) compatible with reduction in the size and weight of electronic components in recent years, an increase in the quantity of work hardening by increasing reduction ratio of the cold rolling becomes indispensable.

Consequently, as for the above-described high-strength materials, the bendability cannot be adequately improved against the above-described sharp bending e.g., U-bending or 90° bending after notching, by means of microstructure control, e.g. grain refining or control of the state of dispersoids, disclosed in Patent Documents 1, 2, and 3.

On the other hands as for Cu—Fe—P copper alloys, it is proposed to control the microstructure (refer to Patent Documents 4 and 5). Specifically, it is proposed in Patent Document 4 that an intensity ratio, I(200)/I(220), of X-ray diffraction of (200) to X-ray diffraction of (220) of the copper alloy sheet is 0.5 or more and 10 or less, the density of Cube orientation: D(Cube orientation) is 1 or more and 50 or less, or a ratio, D(Cube orientation)/D(S orientation) of the density of Cube orientation: D(Cube orientation) to the density of S orientation: D(S orientation) is 0.1 or more and 5 or less.

It is proposed in Patent Document 5 that an intensity ratio, [I(200)+I(311)]/I(220), of the sum of X-ray diffraction of (200) and X-ray diffraction of (311) to X-ray diffraction of (220) is 0.4 or more.

[Patent Document 1] Japanese Unexamined Patent Application Publication No. 2000-178670 (Claims)

[Patent Document 2] Japanese Unexamined Patent Application Publication No. 6-235035 (Claims)

[Patent Document 3] Japanese Unexamined Patent Application Publication No. 2001-279347 (Claims)

[Patent Document 4] Japanese Unexamined Patent Application Publication No. 2002-339028 (Claims, paragraphs 0020 to 0030)

[Patent Document 5] Japanese Unexamined Patent Application Publication No. 2000-328157 (Claims, examples)

DISCLOSURE OF INVENTION

Problems to be Solved by the Invention

It is certain that the bendability can be improved by specifying the intensity ratio, I(200)/I(220), of X-ray diffraction of (200) of the copper alloy sheet to X-ray diffraction of (220) or by specifying the density of Cube orientation D(Cube orientation) or the density ratio, D(Cube orientation)/D(S orientation) of the Cube orientation to the S orientation, as disclosed in Patent Document 4

The bendability can also be improved by specifying the intensity ratio, [I(200)+I(311)]/I(220), of the sum of X-ray diffraction of (200) and X-ray diffraction of (311) to X-ray diffraction of (200) to be 0.4 or more, as disclosed in Patent Document 5.

However, as for the strength and the electrical conductivity, the hardness of the copper alloy sheet is on the order of 150 Hv at the maximum, and the electrical conductivity is on the order of 65% IACS at the maximum, even in the copper alloy sheet Improved according to Patent Document 4. If the strength of the copper alloy sheet is increased to 150 Hv or more, the electrical conductivity and, in particular, the bendability are reduced. That is, the microstructure control disclosed in Patent Document 4 has a serious limitation. In particular, the bendability of the Cu—Fe—P high-strength material (the hardness of copper alloy sheet is 150 Hv or more, and the electrical conductivity is 75% IACS or more) cannot be improved.

Even in the copper alloy sheet improved according to the examples of Patent Document 5, the electrical conductivity of the example, in which the largest tensile strength of 520 MPa is attained, is on the order of a significantly low 35% IACS. On the other hand, in the example exhibiting the electrical conductivity of 75% IACS or more, the tensile strength is 480 MPa at the maximum and, therefore, the hardness of the copper alloy sheet is at the level slightly higher than 150 Hv. Consequently, one of the strength and the electrical conductivity is sacrificed, and the bendability of the Cu—Fe—P high-strength material cannot be improved by the microstructure control disclosed in Patent Document 5

The present invention was made to overcome the above-described problems. Accordingly it is an object of the present invention to provide a Cu—Fe—P copper alloy sheet which has the high strength and the high electrical conductivity compatible with excellent bendability.

Means for Solving the Problems

In order to achieve this object, a copper alloy sheet used for an electric and electronic component according to an aspect of the present invention is a copper alloy sheet having bendability and containing 0.01% to 3.0% of Fe and 0.01% to 0.3% of P on a percent by mass basis, wherein the orientation density of the Brass orientation is 20 or less, and the sum of the orientation densities of the Brass orientation, the S orientation, and the Copper orientation is 10 or more and 50 or less in the microstructure of the copper alloy sheet.

Preferably, the present invention is applied to improve the bendability of a high strength, highly electrically conductive copper alloy sheet used for electric and electronic components, the copper alloy sheet having strength of 150 Hv or more in terms of hardness and an electrical conductivity of 75% IACS or more.

In order to achieve the above-described high strength and high electrical conductivity, the copper alloy sheet of the present invention may further contain 0.001% to 0.5% of Sn on a percent by mass basis.

The copper alloy sheet of the present invention can be applied to various electric and electronic components. In particular, it is preferable that the copper alloy sheet is used for a semiconductor IC lead frame serving as a semiconductor component.

Advantages

In general copper alloy sheets the following microstructures referred to as the Cube orientation the Goss orientation, the Brass orientation (hereafter may be referred to as B orientation) the Copper orientation (hereafter may be referred to as Cu orientation), the S orientation, and the like are primarily formed, and crystal faces in accordance with them are present.

The formation of these microstructures varies depending on working and heat treatment methods even when the crystal system is the same. The microstructure of a sheet produced by rolling is represented by a plane of rolling and a direction of rolling. The plane of rolling is expressed by {ABC}, and the direction of rolling is expressed by <DEF>. Each orientation is represented as described below based on the above-described expression.

Cube orientation {001} <100>
Goss orientation {011} <100>
Rotated-Goss orientation {011} <011>
Brass orientation (B orientation) {011} <211>
Copper orientation (Cu orientation) {112} <111> (or D orientation) {4 4 11} <11 11 8>
S orientation {123} <634>
B/G orientation {011} <511>
B/S orientation {168} <211>
P orientation {011} <111>

In the present invention basically, crystal faces deviated from the above-described crystal face by ±10° or less are assumed to belong to the same crystal face. Here, the B orientation, the Cu orientation, and the S orientation are present as a fiber microstructure (β-fiber) in which these orientations change continuously therebetween.

The microstructure of a general copper alloy sheet is composed of significantly many orientation factors as described above. When the compositional ratio thereof is varied, the plastic anisotropy of the sheet material is varied, and the workability of bending and the like is varied.

In the above-described Patent Document 4, it is intended to achieve the improvement and the stabilization of the bendability by controlling the orientation density of, in particular, the Cube orientation [hereafter may be referred to as D(Cube)] in the microstructure within a suitable range. This is directed to perform uniform deformation during bending, e.g., stamping, in the use for a semiconductor IC lead frame.

That is, if the Cube orientation is strongly developed to an excessive extent and D(Cube) becomes higher than the suitable range, the plastic anisotropy in the sheet surface becomes strong. Consequently, a portion which tends to be deformed and a portion which is resistant to deformation are partially generated, and problems tend to occur in that bending, burrs, and the like occur in the above-described stamping. On the other hand, if the Cube orientation is reduced or D(Cube) is lower than the suitable range, development of other orientation densities is enhanced, and problems similar to that in the above description occur due to another anisotropy in the surface.

However, according to findings of the inventors of the present invention, in particular, the bendability of the Cu—Fe—P high-strength material having a hardness of copper alloy sheet of 150 Hv or more, and an electrical conductivity of 75% IACS or more cannot be improved by control of the above-described Cube orientation.

That is, the orientation density of the Brass orientation (B orientation) is decreased to improve the bendability while the above-described high strength is maintained. Furthermore, the sum of the orientation densities of the B orientation, the S orientation, and the Cu orientation is controlled within a specific range such that the above-described high strength and the bendability are exhibited in combination while being well-balanced.

As for the Cu—Fe—P copper alloy sheet having a hardness of 150 Hv or more, among the above-described microstructures, in particular, the orientation density of the B orientation and, furthermore, the orientation densities of the B orientation, the S orientation, and the Cu orientation exert a large influence on the strength. The rolling microstructures are developed and the strength is increased as the orientation densities of the B orientation, the S orientation, and the Cu orientation are increased.

However, conversely, the bendability is reduced as the orientation density of the B orientation is increased or the sum of the orientation densities of the B orientation, the S orientation, and the Cu orientation is increased. On the other hand, the crystal orientations are randomized, the strength is decreased, and the bendability is improved as the orientation density of the B orientation is decreased or the sum of the orientation densities of the B orientation, the S orientation, and the Cu orientation is decreased.

That is, as for the Cu—Fe—P copper alloy sheet having a hardness of 150 Hv or more, in order to improve the bendability while the high strength is maintained, it is effective that the orientation density of the B orientation is decreased and, in addition, the sum of the orientation densities of the B orientation, the S orientation, and the Cu orientation is controlled within a specific range.

BEST MODE FOR CARRYING OUT THE INVENTION (Measurement of Orientation Density)

In the present invention, measurements of the orientation density of the B orientation and the sum of the orientation densities of the B orientation, the S orientation, and the Cu orientation can be performed by using a usual X-ray diffraction method.

The orientation density of each orientation can be determined by measuring the pole figures of (100), (110), and (111), and subsequently, calculating a ratio of the intensity peak of a specific orientation (Cu orientation, B orientation, or S orientation) to the sum of the intensity peak value of each orientation through the use of the orientation distribution function (ODF). These measuring methods are disclosed in "Shugososhiki (Microstructure)" edited and written by Shinichi Nagashima, published by Maruzen Company, Limited, 1984, P 8 to 44, JIM Seminar "Shugososhiki (Microstructure)", edited by the Japan Institute of Metals, 1981, P 3 to 7, and the like.

The orientation density of each orientation can also be attained by determining the orientation density through the use of the orientation distribution function based on the data measured by an electron diffraction method with TEM, a SEM (Scanning Electron Microscope)-ECP (Electron Channeling Pattern) method, or a SEM-EBSP [Electron Back Scattering (Scattered) Pattern, or may be referred to as EBSD (Diffraction)] method.

Since these orientation distributions vary in the sheet thickness direction, preferably, these are determined by averaging some points taken in the sheet thickness direction. However, since the copper alloy sheet used for a semiconductor material, e.g., an IC lead frame, is a thin sheet having a sheet thickness of about 0.1 to 0.3 mw, evaluation can also be performed based on the value measured with that thickness.

(Significance of Orientation Density)

As described above, in the present invention, in order to make the Cu—Fe—P copper alloy sheet have the high strength and the high electrical conductivity compatible with excellent bendability, the development of the rolling microstructure of a specific orientation is adjusted. For this purpose, the orientation density of the B orientation is specified to be 20 or less, and the sum of the orientation densities of the B orientation, the S orientation, and the Cu orientation is specified to be 10 or more and 50 or less.

In the above-described usual Cu—Fe—P copper alloy sheet having high-strength (the hardness is 150 Hv or more) compatible with reduction in the size and weight of electronic components, the quantity of work hardening is increased by increasing reduction ratio of the cold rolling and, therefore, the rolling microstructure is excessively developed indispensably. Consequently, the orientation density of the B orientation indispensably exceeds 20, and the sum of the orientation densities of the B orientation, the S orientation, and the Cu orientation is indispensably increased and exceeds 50. This holds true for the case where the copper alloy sheet described in the above-described Patent Document 4 is subjected to an increase in reduction ratio.

The development of this rolling microstructure exerts an influence on other orientation densities, e.g., the above-described Cube orientation. However, in particular, in the region of a high strength copper alloy sheet having a hardness of 150 Hv or more, the influence of the development of the Cu orientation, B orientation, and the S orientation on the bendability is significantly larger than those of other orientation densities, e.g., the above-described Cube orientation.

As described above, when the orientation density of the B orientation exceeds 20, or the sum of the orientation densities of the B orientation, the S orientation, and the Cu orientation exceeds 50, the bendability cannot be improved at the above-described high strength, as in the examples described below.

Therefore, in the present invention, the orientation density of the B orientation is specified to be 20 or less, and the sum of the orientation densities of the B orientation, the S orientation, and the Cu orientation is specified to be 50 or less. In this manner, the bendability can be improved while the above-described high strength is maintained, as in the examples described below.

On the other hand, the quantity of work hardening by the cold rolling must be decreased in order to make the sum of the orientation densities of the B orientation, the S orientation, and the Cu orientation less than 10. Therefore, if the sum of the orientation densities of the B orientation, the S orientation, and the Cu orientation is less than 10, although the bendability can be improved, the above-described high strength cannot be maintained, and the hardness becomes less than 150 Hv, as in the examples described below. Consequently, the strength required of the copper alloy used for an IC lead frame of the semiconductor is not satisfied.

(Component Composition of Copper Alloy Sheet)

The chemical component composition of the Cu—Fe—P copper alloy sheet of the present invention suitable for satisfying the strength and the electrical conductivity required in the use for the IC lead frame of the semiconductor and the like will be described below.

In the present invention, as for the basic composition to achieve the high strength and the high electrical conductivity, i.e. the strength of 150 Hv or more in terms of hardness and the electrical conductivity of 75% IACS or more, the content of Fe is specified to be within the range of 0.01% to 3.0% the content of the above-described P is specified to be within the range of 0.01% to 0.3%, on a percent by mass basis, and the remainder is composed of Cu and incidental impurities. In another aspect, the following range of at least one of Zn and Sn may be further contained relative to this basic composition. Other selectively added elements and impurity elements may be contained within the bounds of not impairing these properties. In the following description, every content is expressed in percent by mass.

(Fe)

Iron (Fe) precipitates as Fe or a Fe-based intermetallic compound, and is an important element which improves the strength and the softening resistance of the copper alloy. If the content of Fe is less than 0.01%, the quantity of generation of the above-described precipitated particles is small depending on the production condition. Although the electrical conductivity is satisfactorily improved the contribution to an improvement of the strength is unsatisfactory, so that the strength is Inadequate. On the other hand, if the content of Fe exceeds 3.0% the electrical conductivity tends to be decreased. When the quantity of precipitation is increased to intentionally increase the electrical conductivity, conversely, precipitated particles are grown and become coarse, so that the strength and the bendability are reduced. Therefore, the content of Fe is specified to be within the range of 0.01% to 3.0%.

(P)

Phosphorous (P) effects deoxidation and, in addition, P is an important element which forms a compound with Fe to increase the strength of the copper alloy. If the content of P is less than 0.01%, a desired strength cannot be attained since the precipitation of the compounds is unsatisfactory depending on the production condition. On the other hand, if the content of P exceeds 0.3%, the electrical conductivity is decreased and, furthermore, the hot workability is reduced. Therefore, the content of P is specified to be within the range of 0.01% to 0.3%.

(Zn)

Zinc (Zn) improves the heat-peeling resistance of solder and Sn plating of the copper alloy, while this property is required of the IC lead frame and the like. If the content of Zn is less than 0.005%, a desired effect is not exerted. On the other hand, if the content exceeds 3.0%, the solder wettability is reduced and, in addition, the electrical conductivity is significantly decreased. Therefore, when Zn is contained optionally, the content thereof is specified to be 0.005% to 3.0%.

(Sn)

Tin (Sn) contributes to the improvement of strength of the copper alloy. If the content of Sn is less than 0.001%, no contribution is made to an increase in the strength. On the other hand, if the content of Sn is increased to a large extent, the effect thereof is saturated. Conversely, the electrical conductivity is significantly decreased and, in addition, the bendability is deteriorated.

In consideration of this point, Sn is selectively contained at a content within the range of 0.001% to 0.5% in order that the copper alloy sheet has strength of 150 Hv or more in terms of hardness and electrical conductivity of 75% IACS or more. Furthermore, Sn is selectively contained at a content within the range of more than 0.5% and 5.0% or less in order that the copper alloy sheet has higher strength of 190 Hv or more in terms of hardness and electrical conductivity of 50% IACS or more. As described above, the Sn is contained in accordance with the balance between the strength (hardness) and the electrical conductivity required in the application, and as a whole, the Sn content is selected within the range of 0.001% to 5.0%.

(Content of Mn, Mg, and Ca)

Since Mn, Mg, and Ca contribute to an improvement of the hot workability of the copper alloy, these are selectively contained when their effects are necessary. If the total content of at least one of Mn, Mg, and Ca is less than 0.0001%, a desired effect is not exerted. On the other hand, if the total content exceeds 1.0%, coarse crystallized materials and oxides are generated and, thereby, not only the bendability is deteriorated, but also the electrical conductivity is decreased significantly. Therefore, these elements are selectively contained at the total content within the range of 0.0001% to 1.0%.

(Content of Zr, Ag, Cr, Cd, Be, Ti, Co, Mi, Au, and Pt)

These components exert an effect of improving the strength of the copper alloy and, therefore, these are selectively contained when their effects are necessary. If the total content of at least one of these components is less than 0.001%, a desired effect is not exerted. On the other hand, if the total content thereof exceeds 1.0%, coarse crystallized materials and oxides are generated and, thereby, not only the bendability is deteriorated, but also the electrical conductivity is decreased significantly. This is not preferable. Therefore, these components are selectively contained at the total content within the range of 0.001% to 1.0%. In the case where these components are contained together with the above-described Mn, Mg, and Ca, the sum of the contents of these elements contained is specified to be 1.0% or less.

(Content of Hf, Th, Li, Na, Ke, Sr, Pd, W, S, Si, C, Nb, Al, V, Y, Mo, Pb, In, Ga, Ge, As, Sb, Bi, Te, B, and Misch Metal)

These components are impurity elements. If the total content of these elements exceeds 0.1% coarse crystallized materials and oxides are generated and, thereby, the bendability is deteriorated. Therefore it is preferable that the total content of these elements is specified to be 0.1% or less.

(Production Condition)

Preferable production conditions to make the copper alloy sheet microstructure compatible with the above-described microstructure specified according to the present invention will be described below. The copper alloy sheet of the present invention can be produced through the same process as the normal process except preferable conditions, e.g. reduction ratios (cold rolling ratios) in the finish cold rolling and the low-temperature annealing to attain the above-described microstructure specified according to the present invention. Therefore, the normal production process itself is in no need of being changed significantly.

That is, the copper alloy melt adjusted to have the above-described preferable chemical composition is cast. The resulting ingot is subjected to facing, and to a heat treatment or a homogenizing heat treatment. Thereafter, hot rolling is performed and a hot-rolled sheet is water-cooled.

Subsequently, primary cold rolling referred to as intermediate rolling is performed followed by annealing and cleaning. Furthermore, finish (final) cold rolling and low temperature annealing (final annealing, finish annealing) are performed, so that a copper alloy sheet and the like having a product sheet thickness is produced. For example, when the copper alloy sheet is used for a semiconductor material, e.g., an IC lead frame, the product sheet thickness is about 0.1 to 0.3 mm.

A solution heat treatment and a quenching treatment by water-cooling of the copper alloy sheet may be performed before the primary cold rolling. At this time, the solution heat treatment temperature is selected within the range of 750° C. to 1,000° C., for example.

Here, in order to perform control such that the orientation density of the B orientation becomes 20 or less, and the sum of the orientation densities of the B orientation, the S orientation, and the Cu orientation becomes 10 or more and 50 or less, as described above, it is effective that the above-described finish cold rolling is performed at a cold rolling ratio of 10% to 50% per pass and, thereafter, the above-described finish annealing is performed at a low temperature condition of 100° C. to 400° C. for 0.2 minutes or more and 300 minutes or less.

(Finish Cold Rolling)

In order to attain the hardness of 150 Hv or more of the Cu—Fe—P copper alloy sheet having high-strength, in the present invention as well, the quantity of work hardening is increased (high accumulation of introduced dislocations based on the Orowan mechanism) by increasing reduction ratio of the finish cold rolling. However, it is preferable to set the cold rolling ratio of the finish cold rolling at 10% to 50% per pass in order that the rolling microstructure is not excessively developed. Preferably, the number of passes of the finish cold rolling is usually set at 3 to 4 times to prevent the number of passes from becoming too small or too large.

When this usual number of passes is adopted, if the cold rolling ratio of the finish cold rolling exceeds 50% per pass, there is a high probability that the orientation density of the B orientation exceeds 20, or the sum of the orientation densities of the B orientation, the S orientation, and the Cu orientation is increased to more than 50 depending on the chemical composition of the copper alloy, the production history up to that time, and the production condition.

On the other hand, if the cold rolling ratio of the finish cold rolling is less than 10% per pass, the sum of the orientation densities of the B orientation the S orientation, and the Cu orientation tends to become less than 10, and there is a high probability that the quantity of work hardening by the cold rolling becomes unsatisfactory. Consequently, although the bendability can be improved, there is a high probability that the above-described high strength cannot be maintained, and the hardness becomes less than 150 Hv.

(Finish Annealing)

In the present invention, preferably, the finish annealing is intentionally performed at a low temperature to control the microstructure after the finish cold rolling is completed. In a usual method for manufacturing the copper alloy sheet used for an IC lead frame, in contrast to the above-described Patent Document 4, the finish annealing is not performed after the finish cold rolling except the straightening annealing (350° C.×20 seconds) performed in the example disclosed in the above-described Patent Document 5, to avoid the reduction in strength. However, in the present invention, this reduction in strength is suppressed by the above-described cold rolling condition and by lowering the temperature of the finish annealing. When the finish annealing is performed at a low temperature, each orientation density is controlled within the above-described range and, thereby the strength and the bendability are improved.

Under the condition that the annealing temperature is lower than 100° C., the annealing time is less than 0.2 minutes or this low-temperature annealing is not performed, there is a high probability that the microstructure and the properties of the copper alloy sheet are hardly varied from the state after the finish cold rolling. Consequently there is a high probability that each orientation density cannot be controlled within the above-described range. For example, the orientation density of the B orientation may exceed 20 or the sum of the orientation densities of the B orientation, the S orientation, and the Cu orientation may be increased to more than 50. Conversely when the annealing is performed at an annealing temperature exceeding 400° C. or for a annealing time exceeding 300 minutes, recrystallization occurs, rearrangement and recovery phenomena of dislocations occur excessively, precipitates become coarse and, therefore there is a high probability that the strength is decreased.

EXAMPLES

The examples of the present invention will be described below Copper alloy thin sheets having various microstructures were produced by changing the cold rolling ratio per pass of the finish cold rolling and the temperature and the time of the finish annealing. Subsequently, properties, e.g., the hardness, the electrical conductivity, and the bendability, were evaluated.

Specifically, each copper alloy having the chemical component composition shown in Tables 1 and 2 was melted in a coreless furnace, and an ingot-making was performed by a semicontinuous casting method, so that an ingot of 70 mm in thickness×200 mm in width×500 mm in length was prepared. The surface of each ingot was subjected to facing, followed by heating. Thereafter, hot rolling was performed at a temperature of 950° C. to prepare a sheet of 16 mm in thickness, and the resulting sheet was quenched in water from a temperature of 750° C. or more. Oxidized scale was removed and, thereafter, primary cold rolling (intermediate rolling) was performed. The resulting sheet was subjected to facing and, thereafter, finish cold rolling was performed in which 3 passes of cold rolling were performed with intermediate annealing therebetween. Subsequently, finish annealing was performed, so that a copper alloy sheet of about 0.15 mm in thickness was produced.

In each copper alloy shown in Tables 1 and 2, the remainder of the composition other than the elements described in Tables 1 and 2 was Cu. The total content of other impurity elements, Hf, Th, Li Na, K, Sr, Pd, W, S, Si, C, Nb, Al, V, Y, Mo, Pb, In, Ga, Ge, As, Sb, Bi, Te, B, and misch metal, was 0.1 percent by mass or less, the total content including the contents of elements described in Table 1 or 2.

In the case where at least one of Mn, Mg, and Ca was contained, the total content was specified to be within the range of 0.0001 to 1.0 percent by mass. In the case where at least one of Zr, Ag, Cr, Cd, Be, Ti, Co, Ni, Au, and Pt was contained, the total content was specified to be within the range of 0.001 to 1.0 percent by mass. Furthermore, the total content of all these elements was specified to be 1.0 percent by mass or less.

The cold rolling ratio (%) per pass of the finish cold rolling and the temperature and the time (° C.×min) of the finish annealing are shown in Tables 1 and 2.

In each example, samples were cut from the thus produced copper alloy sheet, the microstructure was measured, and a measurement of the hardness, a measurement of the electrical conductivity, a bending test, and a press moldability test were performed. The results thereof are shown in Tables 1 and 2.

The above-described press moldability test was performed for the purpose of checking whether the improvement of the bendability had the adverse effect of reducing the press moldability that is one of important properties required of IC lead frame materials and the like.

(Measurement of Microstructure)

Pole figures of (100), (110), and (111) of the copper alloy sheet sample were measured by a usual X-ray diffraction method through the use of Cu as a target on the condition that the tube voltage was 50 KV and the tube current was 200 mA. A ratio of the intensity peak of a specific orientation to the sum of the intensity peak value of each orientation was calculated from this measurement result through the use of the orientation distribution function (ODF), and the orientation density of the B orientation and the sum of the orientation densities of the B orientation, the S orientation, and the Cu orientation were determined. As for the X-ray diffraction intensity, diffraction intensities of the (200) face [=(100) face] and the (220) face [=(110) face] were measured with an X-ray diffraction apparatus produced by Rigaku Corporation and, thereby, an intensity ratio of diffraction of (200) to that of (220) was determined.

(Measurement of Hardness)

A measurement of hardness of the copper alloy sheet sample was performed at four points with a micro Vickers hardness meter by applying a load of 0.5 kg, and an average value thereof was taken as the hardness.

(Measurement of Electrical Conductivity)

The copper alloy sheet sample was processed into a slip-shaped test piece of 10 μm in width and 300 mm in length by milling, an electric resistance was measured with a double bridge resistance meter, and the electrical conductivity was calculated by an average cross-sectional area method.

(Evaluation Test of Bendability)

A bending test of the copper alloy sheet sample was performed in conformity with Japan Copper and Brass Association Standard. A test piece of 10 mm in width and 30 mm in length was taken from each sample, Bad Way (B. W.: the bending axis is parallel to the rolling direction) bending was performed, and an evaluation was performed based on a ratio, R/t, of a minimum bending radius R at which no crack occurs to the sample sheet thickness t. That the value of R/t is 0 refers to that it is possible to perform 180° U-bending where a minimum bending radius R is 0. The bendability becomes excellent as the value of R/t becomes small, and it can be said that the bendability is compatible with the U-bending or the 90° bending after notching in a practical IC lead frame when the R/t is 1.0 or less.

The bending test condition of this evaluation of the bendability corresponds to the U-bending or the 90° bending ater notching in a practical IC lead frame and, therefore, is severer than that of the bending test in the above-described Patent Document 4 (the 90° bending is performed at R of 0.25 mm, the outer surface side of the bent portion is observed with an optical microscope, and an evaluation is performed based on the presence or absence of surface roughening and the presence or absence of crack). The direction of taking of the test piece is not described in the above-described Patent Document 4. However, in general, the bendability is evaluated in the G. W. (the bending axis is perpendicular to the rolling direction). Therefore, it can be said that the bending condition of the present invention is severe, from this point of view as well.

(Evaluation Test of Press Moldability)

A lead of 0.3 mm in width was punched in the copper alloy sheet sample by mechanical press. The height of a burr of the resulting lead was measured and the press-moldability was evaluated. At this time, burr surfaces of ten leads were measured by a method in which observation was performed with a scanning electron microscope, and an average value of maximum heights of the ten respective leads was taken as the height of the burr. Samples having a burr height of 3 μm or less were evaluated as excellent in press-moldability and are indicated by ○, samples having a burr height of 3 to 6 μm are indicated by Δ, and samples having a burr height exceeding 6 μm were evaluated as poor in press-moldability and are indicated by x.

As is clear from Table 1 copper alloys of Invention examples 1 to 7 which have compositions within the scope of the present invention are produced by production methods performed on the conditions that the cold rolling ratio (%) per pass of the finish cold rolling, the temperature and time (° C.×mm) in the finish annealing, and the like are in the preferable ranges. Consequently, the microstructures of the copper alloys of Invention examples 1 to 7 have the orientation densities of the B orientation of 20 or less, and the sums of the orientation densities of the B orientation, the S orientation, and the Cu orientation of 10 or more and 50 or less.

As a result, the copper alloys of Invention examples 1 to 7 have hardness of 150 Hv or more and electrical conductivity of 75% IACS or more and, therefore, high strength, high electrical conductivity, and excellent bendability are exhibited. Furthermore, the press-moldability that is another important property is not reduced.

On the other hand, in the copper alloy of Comparative example 8, the content of Fe is 0.006%, and is out of the lower limit of 0.01% The copper alloy is produced by a production method including the finish cold rolling, the finish annealing, and the like performed on the conditions within the preferable ranges. Consequently, the microstructure of the copper alloy becomes within the scope of the invention, and excellent bendability is exhibited. However, the hardness is low, the electrical conductivity is also low, and high strength and high electrical conductivity cannot be achieved.

In the copper alloy of Comparative example 9, the content of Fe is 4.5%, and is out of the higher limit of 3.0%. The copper alloy is produced by a production method including the finish cold rolling, the finish annealing, and the like performed on the conditions within the preferable ranges. Consequently, the microstructure becomes within the scope of the invention, and the hardness becomes high. However, the electrical conductivity is significantly low, and the bendability is poor.

In the copper alloy of Comparative example 10, the content of P is 0.007%, and is out of the lower limit of 0.01%. The copper alloy is produced by a production method including the finish cold rolling, the finish annealing, and the like performed on the conditions within the preferable ranges. Consequently, the microstructures becomes within the scope of the invention, and excellent bendability is exhibited. However, the hardness is low, the electrical conductivity is also low, and high strength and high electrical conductivity cannot be achieved.

In the copper alloy of Comparative example 11, the content of P is 0.35%, and is out of the higher limit of 0.3%. The copper alloy is produced by a production method including the finish cold rolling, the finish annealing, and the like performed on the conditions within the preferable ranges. Consequently, the microstructure becomes within the scope of the invention, and the hardness becomes high. However, the electrical conductivity is significantly low, and the bendability is poor.

The copper alloy of Comparative example 12 is a copper alloy having a composition within the scope of the present invention, and is produced by the finish cold rolling performed on the condition in the preferable range. However, no finish annealing is conducted. Consequently, the microstructure has an excessively high orientation density of the B orientation, and the sum of the orientation densities of the B orientation, the S orientation, and the Cu orientation is also excessively high. As a result, considering that the strength is at a low level, the bendability and the electrical conductivity are significantly poor. This Comparative example 12 corresponds to Invention example 3 in Patent Document 4 in regard to the copper alloy composition, no conduction of finish annealing, and the like, although the conditions of rolling, e.g., the finish cold rolling, are slightly different.

The copper alloy of Comparative example 13 is a copper alloy having a composition within the scope of the present invention. However, the temperature of the finish annealing is too low, and the time is too long. Consequently, although the hardness is high, the electrical conductivity is significantly low. Furthermore, the microstructure has an excessively high orientation density of the B orientation, and has an excessively high sum of the orientation densities of the B orientation, the S orientation, and the Cu orientation. As a result, the bendability is significantly poor.

The copper alloy of Comparative example 14 is a copper alloy having a composition within the scope of the present invention, and is produced by the finish cold rolling performed on the condition in the preferable range. However, the temperature of the finish annealing is too high. Consequently, the hardness is a significantly low 120 Hv. The microstructure has an excessively low sum of the orientation densities of the B orientation, the S orientation, and the Cu orientation. Furthermore, since the hardness is significantly low, the bendability shows a good result.

The copper alloy of Comparative example 15 is a copper alloy having a composition within the scope of the present invention, and is produced by the finish cold rolling performed on the condition in the preferable range. However, no finish annealing is conducted. Consequently, the microstructure has an excessively high orientation density of the B orientation, and has an excessively high sum of the orientation densities of the B orientation, the S orientation, and the Cu orientation. As a result, the bendability and the electrical conductivity are significantly poor. It can be said that examples including this Comparative example 15 and the above-described Comparative example 12, in which no finish annealing is conducted as described above, are typical examples of usual (common) production methods in which no finish annealing is conducted. Therefore, the significance of the control of microstructure through the low-temperature annealing in the present invention is understood.

The copper alloy of Comparative example 16 is a copper alloy having a composition within the scope of the present invention. However, the cold rolling ratio per pass of the finish cold rolling is too low. Consequently, the hardness is a significantly low 138 Hv. The microstructure has an excessively low sum of the orientation densities of the B orientation, the S orientation, and the Cu orientation. Furthermore, since the hardness is significantly low, the bendability shows a good result.

The copper alloy of Comparative example 17 is a copper alloy having a composition within the scope of the present invention. However, the cold rolling ratio per pass of the finish cold rolling is too high. The orientation density of the B orientation is too high. Although the sum of the orientation densities of the B orientation, the S orientation, and the Cu orientation is within the scope of the invention, the bendability is significantly poor. It can be said that this Comparative example 17 is, so to say, a typical example of this type of known high-strength copper alloy sheet in which the strength is increased by increasing reduction ratios of the cold rolling.

As is clear from Table 2, copper alloys of Invention examples 18 to 20 which contain selectively added elements and which have compositions within the scope of the present invention are produced by production methods performed on the conditions that the cold rolling ratio (%) per pass of the finish cold rolling, the temperature and time (° C.×min) in the finish annealing, and the like are also in the preferable ranges. Consequently, the microstructures of the copper alloys of Invention examples 18 to 20 have the orientation densities of the B orientation of 20 or less, and the sums of the orientation densities of the B orientation, the S orientation, and the Cu orientation of 10 or more and 50 or less.

As a result, the copper alloys of Invention examples 18 to 20 have high hardness of 150 Hv or more and electrical conductivity of 75% IACS or more and, therefore, high strength, high electrical conductivity, and excellent bendability are exhibited. Furthermore, the press-moldability that is another important property is not reduced.

Furthermore, Invention examples 21 to 24 in Table 2 show the case where copper alloys have compositions within the scope of the present invention and the content of Sn is somewhat high. The copper alloys of Invention examples 21 to 24 are produced by production methods performed on the conditions that the cold rolling ratio (%) per pass of the finish cold rolling, the temperature and time (° C.×min) in the finish annealing, and the like are also in the preferable ranges. Consequently, the microstructures have the orientation densities of the B orientation of 20 or less, and the sums of the orientation densities of the B orientation, the S orientation, and the Cu orientation of 10 or more and 50 or less.

As a result, the copper alloys of Invention examples 21 to 24 have high hardness of 190 Hv or more and electrical conductivity of 50% IACS or more and, therefore, high strength, high electrical conductivity, and excellent bendability are exhibited. Furthermore, the press-moldability that is another important property is not reduced.

In the copper alloy of Comparative example 25, as in Comparative example 11, the content of P is out of the higher limit of 0.3%. The copper alloy is produced by a production method including the finish cold rolling, the finish annealing, and the like performed on the conditions within the preferable ranges. Consequently, the microstructure becomes within the scope of the invention. However, the electrical conductivity is significantly low, and the bendability is poor considering that the hardness is high.

In the copper alloy of Comparative example 26, as in Comparative example 9, the content of Fe is out of the higher limit of 3.0%. The copper alloy is produced by a production method including the finish cold rolling, the finish annealing, and the like performed on the conditions within the preferable ranges. Consequently, the microstructure becomes within the scope of the invention. However, the electrical conductivity is significantly low, and the bendability is poor considering that the hardness is high.

The copper alloy of Comparative example 27 is a copper alloy having a composition within the scope of the present invention. However, as in Comparative example 13, the temperature of the finish annealing is too low, and the time is too long. Consequently, the electrical conductivity is significantly low considering that the hardness is high Furthermore, the microstructure has an excessively high orientation density of the B orientation, and has an excessively high sum of the orientation densities of the B orientation, the S orientation, and the Cu orientation. As a result, the bendability is significantly poor.

The copper alloy of Comparative example 28 is a copper alloy having a composition within the scope of the present invention, and is produced by the finish cold rolling performed on the condition in the preferable range. However, as in Comparative examples 12 and 15, no finish annealing is conducted Consequently, the microstructure has an excessively high orientation density of the B orientation, and has an excessively high sum of the orientation densities of the B orientation, the S orientation, and the Cu orientation. As a result, the hardness is low and the bendability is poor.

The above-described results corroborate the significance of the critical chemical composition and microstructure of the copper alloy sheet of the present invention to achieve high strength and high electrical conductivity, as well as excellent bendability, and the significance of preferable production conditions to attain the microstructure.

TABLE 1

| | | Chemical component composition of copper alloy sheet (remainder: Cu and impurities) | | | | | Finish cold rolling cold rolling ratio | Finish annealing (° C. × min) | Copper alloy sheet microstructure | | Copper alloy sheet properties | | | |
|---|---|---|---|---|---|---|---|---|---|---|---|---|---|---|
| | | | | | | | | | B orientation | B + S + Cu orientation | | Electrical | | |
| Case | Alloy No. | Fe | P | Zn | Sn | Others | %/pass | | density | density | Hardness (Hv) | conductivity (% IACS) | Bendability (R/t) | Press moldability |
| Invention example | 1 | 0.12 | 0.04 | — | — | — | 15 | 200 × 40 | 5 | 14 | 154 | 86 | 0.5 | ○ |
| | 2 | 0.18 | 0.07 | — | — | — | 25 | 350 × 0.5 | 15 | 35 | 161 | 82 | 0.5 | ○ |
| | 3 | 0.43 | 0.15 | — | — | — | 20 | 120 × 200 | 9 | 26 | 167 | 76 | 1.0 | ○ |
| | 4 | 0.08 | 0.03 | 0.1 | — | — | 35 | 250 × 5 | 16 | 38 | 150 | 87 | 0.5 | ○ |
| | 5 | 0.36 | 0.13 | 0.03 | — | — | 15 | 370 × 0.5 | 7 | 20 | 158 | 83 | 0.5 | ○ |
| | 6 | 0.15 | 0.05 | 0.01 | 0.1 | — | 20 | 150 × 120 | 10 | 28 | 169 | 75 | 1.0 | ○ |
| | 7 | 0.17 | 0.06 | 0.2 | 0.03 | — | 40 | 280 × 1 | 19 | 46 | 165 | 77 | 1.0 | ○ |
| Comparative example | 8 | 0.006 | 0.02 | — | — | — | 30 | 300 × 1 | 15 | 37 | 139 | 78 | 0.5 | Δ |
| | 9 | 4.5 | 0.25 | — | — | — | 45 | 200 × 50 | 18 | 48 | 172 | 54 | 2.0 | ○ |
| | 10 | 0.03 | 0.007 | — | — | — | 20 | 350 × 0.3 | 13 | 32 | 136 | 80 | 0.5 | Δ |
| | 11 | 0.95 | 0.35 | — | — | — | 30 | 150 × 100 | 16 | 43 | 168 | 58 | 2.0 | ○ |
| | 12 | 2.2 | 0.04 | 0.15 | 0.04 | — | 40 | none | 35 | 63 | 145 | 65 | 2.0 | ○ |
| | 13 | 0.12 | 0.04 | — | 0.4 | — | 30 | 50 × 280 | 28 | 54 | 170 | 60 | 3.0 | ○ |
| | 14 | 0.10 | 0.03 | 0.01 | 0.01 | — | 20 | 450 × 3 | 3 | 6 | 123 | 87 | 0.5 | x |
| | 15 | 0.15 | 0.05 | 0.05 | 0.02 | — | 30 | none | 32 | 60 | 152 | 72 | 2.0 | ○ |
| | 16 | 0.30 | 0.10 | — | — | — | 5 | 320 × 1 | 3 | 8 | 138 | 85 | 0.5 | Δ |
| | 17 | 0.40 | 0.15 | — | — | — | 60 | 350 × 0.5 | 25 | 45 | 160 | 71 | 2.0 | ○ |

*In expression of the content of each element, "—" indicates that the content is less than a detection limit.

TABLE 2

| | | Chemical component composition of copper alloy sheet (remainder: Cu and impurities) | | | | | Finish cold rolling cold rolling ratio | Finish annealing (° C. × min) | Copper alloy sheet microstructure | | Copper alloy sheet properties | | | |
|---|---|---|---|---|---|---|---|---|---|---|---|---|---|---|
| | | | | | | | | | B orientation | B + S + Cu orientation | | Electrical | | |
| Case | Alloy No. | Fe | P | Zn | Sn | Others | %/pass | | density | density | Hardness (Hv) | conductivity (% IACS) | Bendability (R/t) | Press moldability |
| Invention example | 18 | 0.19 | 0.07 | — | — | Mn: 0.003 | 30 | 300 × 1 | 16 | 37 | 162 | 82 | 0.5 | ○ |
| | 19 | 0.35 | 0.14 | 0.05 | — | Ca: 0.002 Ti: 0.005 | 20 | 350 × 0.5 | 8 | 22 | 160 | 82 | 0.5 | ○ |
| | 20 | 0.43 | 0.15 | 0.02 | 0.09 | Mn: 0.003 Ni: 0.01 Al: 0.001 | 20 | 200 × 40 | 11 | 29 | 170 | 75 | 1.0 | ○ |
| | 21 | 0.15 | 0.07 | 0.08 | 0.52 | — | 20 | 270 × 3 | 12 | 30 | 193 | 63 | 1.5 | ○ |
| | 22 | 0.12 | 0.04 | — | 2.0 | — | 15 | 330 × 1 | 10 | 27 | 215 | 51 | 1.5 | ○ |
| | 23 | 0.10 | 0.03 | 0.3 | 0.8 | Mg: 0.003 Ag: 0.1 | 25 | 300 × 1 | 15 | 35 | 200 | 58 | 1.5 | ○ |
| | 24 | 0.17 | 0.06 | 0.5 | 1.2 | Ca: 0.002 ZR: 0.005 | 20 | 300 × 0.5 | 12 | 30 | 208 | 54 | 1.5 | ○ |
| Comparative example | 25 | 1.0 | 0.36 | — | — | Ca: 0.002 | 25 | 150 × 100 | 16 | 42 | 167 | 58 | 2.0 | ○ |
| | 26 | 4.3 | 0.26 | — | — | Mg: 0.2 Co: 0.002 | 40 | 300 × 1 | 17 | 46 | 175 | 51 | 2.0 | ○ |
| | 27 | 0.11 | 0.04 | — | 0.3 | Mg: 0.003 Cr: 0.3 | 25 | 70 × 240 | 26 | 52 | 169 | 59 | 3.0 | ○ |
| | 28 | 0.15 | 0.05 | 0.02 | 0.04 | Mn: 0.003 Ni: 0.1 Al: 0.002 | 25 | None | 35 | 63 | 155 | 71 | 2.0 | ○ |

*In expression of the content of each element, "—" indicates that the content is less than a detection limit.

INDUSTRIAL APPLICABILITY

As described above, according to the present invention, the Cu—Fe—P copper alloy sheet which has the high strength and the high electrical conductivity compatible with excellent bendability can be provided without deteriorating other properties, e.g., the press-moldability. Consequently, the resulting copper alloy sheet can be applied to lead frames, connectors, terminals, switches, relays, and other uses, in addition to IC lead frames for semiconductor devices, to serve as a downsized and lightweight electric and electronic component, wherein high strength, high electrical conductivity, and excellent bendability capable of enduring sharp bending are required.

The invention claimed is:

1. A copper alloy sheet having bendability and consisting of 0.01% to 3.0% of Fe and 0.01% to 0.3% of P, and Cu and incidental impurities on a percent by mass basis, wherein the orientation density of the Brass orientation is 20 or less, and the sum of the orientation densities of the Brass orientation, the S orientation, and Copper orientation is 10 or more and 50 or less in the microstructure of the copper alloy sheet.

2. The copper alloy sheet according to claim 1, wherein the copper alloy sheet has a strength of 150 Hv or more in terms of hardness and an electric conductivity of 75% IACS or more.

3. The copper alloy sheet according to claim 1, wherein the sheet is obtained by a process comprising cold rolling the sheet in a ratio of 10 to 50% per pass during finish cold rolling.

4. The copper alloy sheet according to claim 3, wherein the ratio is 15 to 40% per pass.

5. The copper alloy sheet according to claim 3, wherein the process comprises finish-annealing the sheet at a temperature of 100° C. or higher and less than 400° C.

6. The copper alloy sheet according to claim 1, wherein the orientation density of the Brass orientation is in a range of from 5 to 19.

7. The copper alloy sheet according to claim 1, wherein the sum of the orientation densities of the Brass orientation, the S orientation, and Copper orientation is in a range of from 14 to 46.

8. The copper alloy sheet according to claim 3, wherein the process comprises finish-annealing the steel at a temperature of from 150° C. to 370° C.

9. The copper alloy sheet according to claim 3, wherein the number of passes of the finish cold rolling is from 3 to 4 times.

10. The copper alloy sheet according to claim 1, comprising 0.08% to 0.43% of Fe on a percent by mass basis.

* * * * *